US007172818B2

United States Patent
Nakaoka et al.

(10) Patent No.: US 7,172,818 B2
(45) Date of Patent: Feb. 6, 2007

(54) COPPER FOIL FOR CHIP-ON-FILM USE, PLASMA DISPLAY PANEL, OR HIGH-FREQUENCY PRINTED CIRCUIT BOARD

(75) Inventors: Tadao Nakaoka, Tochigi (JP); Akitoshi Suzuki, Tochigi (JP); Hideo Otsuka, Tochigi (JP); Hisao Kimijima, Tochigi (JP)

(73) Assignee: Furukawa Circuit Foil Co., Ltd., Nikkou (JP)

(*) Notice: Subject to any disclaimer, the term of this patent is extended or adjusted under 35 U.S.C. 154(b) by 112 days.

(21) Appl. No.: 10/651,099

(22) Filed: Aug. 29, 2003

(65) Prior Publication Data

US 2004/0043242 A1 Mar. 4, 2004

(30) Foreign Application Priority Data

Sep. 2, 2002 (JP) ............................ 2002-256666

(51) Int. Cl.
 B32B 3/00 (2006.01)
 B32B 5/02 (2006.01)
 B32B 5/16 (2006.01)
 B32B 15/20 (2006.01)
(52) U.S. Cl. .................. 428/553; 428/606; 428/607; 428/626; 428/658; 428/675; 428/687
(58) Field of Classification Search ............... 428/606, 428/607, 553, 626, 658, 675, 687
See application file for complete search history.

(56) References Cited

U.S. PATENT DOCUMENTS

| | | | | |
|---|---|---|---|---|
| 5,447,619 A * | 9/1995 | Wolski et al. ............... 205/50 |
| 5,482,784 A | 1/1996 | Ohara et al. |
| 5,569,545 A * | 10/1996 | Yokono et al. ............. 428/626 |
| 5,622,782 A * | 4/1997 | Poutasse et al. ............ 428/344 |
| 5,709,957 A * | 1/1998 | Chiang et al. ............. 428/615 |
| 5,792,333 A * | 8/1998 | Oguro et al. ............... 205/103 |
| 5,800,930 A * | 9/1998 | Chen et al. ................. 428/607 |
| 5,834,140 A | 11/1998 | Wolski et al. |
| 5,858,517 A * | 1/1999 | Tagusari et al. ............ 428/209 |
| 5,863,410 A * | 1/1999 | Yates et al. ................. 205/585 |
| 5,897,761 A * | 4/1999 | Tagusari et al. ............. 205/77 |
| 5,925,451 A * | 7/1999 | Ohya et al. ............... 428/307.3 |
| 6,132,851 A * | 10/2000 | Poutasse .................... 428/209 |
| 6,248,401 B1 * | 6/2001 | Chiang et al. ............. 427/96.8 |
| 6,269,551 B1 * | 8/2001 | Imada et al. .................. 34/266 |
| 6,270,648 B1 * | 8/2001 | Yates et al. ................. 205/138 |
| 6,274,224 B1 * | 8/2001 | O'Bryan et al. ............ 428/209 |
| 6,426,146 B1 * | 7/2002 | Ameen et al. ............. 428/413 |
| 6,475,638 B1 * | 11/2002 | Mitsuhashi et al. ......... 428/606 |
| 6,495,022 B2 * | 12/2002 | Endo et al. ................. 205/176 |
| 6,569,543 B2 * | 5/2003 | Brenneman et al. ........ 428/607 |
| 6,625,869 B2 * | 9/2003 | Jodo ........................... 29/602.1 |
| 6,767,643 B2 * | 7/2004 | Nagai et al. ................ 428/457 |
| 6,776,572 B2 * | 8/2004 | Reist ........................ 414/794.4 |
| 6,808,825 B2 * | 10/2004 | Nagai ......................... 428/626 |
| 6,847,527 B2 * | 1/2005 | Sylvester et al. ........... 361/763 |
| 2001/0042686 A1 | 11/2001 | Taniguchi et al. |
| 2002/0182433 A1 | 12/2002 | Endo |
| 2003/0121697 A1 * | 7/2003 | Nagai et al. |

FOREIGN PATENT DOCUMENTS

| | | | |
|---|---|---|---|
| EP | 0 709 494 A2 | | 5/1996 |
| EP | 0 790 327 | * | 8/1997 |
| EP | 1 132 961 | * | 9/2001 |
| EP | 1 331 088 A1 | | 7/2003 |
| JP | 2000-294251 | * | 10/2000 |
| JP | 2002-38226 | * | 2/2002 |
| WO | 02/24444 A1 | | 3/2002 |
| WO | 03/096776 | * | 11/2003 |

OTHER PUBLICATIONS

English Mchine Tranlastion of 2002-038226, Feb. 2002, JP, Tomioka.*
Web Publication—Theis Precision Steel Corporation, Surface Condition, Apr. 2001.*

* cited by examiner

Primary Examiner—Jennifer C. McNeil
Assistant Examiner—Jason L. Savage
(74) Attorney, Agent, or Firm—Arent Fox PLLC

(57) ABSTRACT

A copper foil for chip-on-film use, a plasma display panel, or a high-frequency printed circuit board obtained by rolling copper foil to smooth the surface to give a surface area of not more than 1.30 times an ideal smooth surface, the smoothed copper foil having deposited on it fine roughening particles of Cu or alloy particles of Cu and Mo or alloy particles comprising Cu and at least one element selected among a group of Ni, Co, Fe, and Cr or a mixture of this alloy particles and oxide of at least one element selected among a group of V, Mo, and W.

7 Claims, 1 Drawing Sheet

COPPER FOIL FOR CHIP-ON-FILM USE, PLASMA DISPLAY PANEL, OR HIGH-FREQUENCY PRINTED CIRCUIT BOARD

BACKGROUND OF THE INVENTION

1. Field of the Invention

The present invention relates to a copper foil most suitable for a fine pattern circuit board, especially for chip-on-film (COF) use or for a high-frequency printed circuit board, and a copper foil most suitable for an electromagnetic shield of a plasma display panel (PDP). Further, the present invention relates to a printed circuit board, a PDP electromagnetic shield, and a high-frequency printed circuit board using this copper foil.

2. Description of the Related Art

Along with the reduction in size and weight of electronic devices, recent electronic parts have been made highly integrated. Corresponding to this, the circuit patterns of printed circuit boards also have had to be made higher in density. Circuit patterns of a fine line width and pitch are now being formed. In particular, IC boards for driving the liquid crystal displays of display units of personal computers, mobile phones, and personal digital assistants (PDA) are being made increasingly higher in density. As ICs are being directly mounted on substrate films, these are called as "chip-on-film" (COF) structures.

In COF mounting, the IC position is detected by light passing through the film formed with the copper foil interconnect patterns. However, the recognition rate of a conventional electrodeposited copper foil for a printed circuit board (ability to detect IC position by light) is very poor. The reason is that the surface of the copper foil is rough. That is, the parts of the film through which the light penetrates are parts from which unnecessary copper foil other than the copper circuit parts are etched away. Unevenness of the surface of the copper foil is transferred and remains on the surface of the film when adhering the copper foil on the film. The unevenness of the film surface therefore becomes larger. Due to the unevenness, when the light passes, the amount of the light able to proceed straight becomes smaller. Therefore, the recognition rate becomes poor.

Conventional copper foil for printed circuit boards is poor in this recognition rate. Therefore, a two-layer material comprised of a polyimide film on which copper layer is formed by sputtering (thin film deposition process) and which is further copper plated is used. However, this sputtered copper layer has only a weak bonding strength to film. Therefore, there was the possibility of the phenomenon that the etchant or plating solution penetrates into the boundary between the copper foil and the film, i.e., the "undercut phenomenon" during the circuit manufacturing process. Further, due to the weak bonding strength between sputtered copper layer and the film, there is the danger of the copper foil peeling off from the substrate during use as a product.

Ordinarily, electrodeposited copper foil produced by an electrodeposited foil production apparatus as shown in FIG. 1 is treated to prevent rust and to roughen its surface to increase bondability by a surface treatment apparatus as shown in FIG. 2. The electrodeposited foil production apparatus comprises a rotating drum-shaped cathode 2 (surface made of SUS or titanium) and an anode 1 (lead or precious metal oxide coated titanium electrode) arranged concentrically with respect to the cathode 2. A current is passed across the electrodes while circulating an electrolyte 3 to cause the copper to deposit on the surface of the cathode 2 to a predetermined thickness, then the copper is peeled off from the surface of the cathode 2 as copper foil 4. In the present specification, the copper foil at this stage is called the "untreated copper foil 4", the surface of the untreated copper foil 4 contacting the electrolyte 3 is called the "matt surface", and the surface contacting the rotating drum shaped cathode 2 is called the "gloss surface".

The untreated copper foil 4 is improved in performance required for a printed circuit board, that is, the bondability to a resin substrate, by being passed through the surface treatment apparatus shown in FIG. 2 and subjected the continuous steps of electrochemical or chemical surface treatment, that is, roughening, metal plating, stainproofing, and silane coupling treatment. In these surface treatments, the roughening is ordinarily applied to the matt surface of the untreated copper foil. The resultant copper foil is used as a surface treated copper foil 8 for a printed circuit board. Note that, in FIG. 2, reference numerals 5 and 6 indicate the electrolyte and reference numeral 7 indicates an anode of the surface treatment apparatus.

One of major factors influencing the etching rate and recognition rate of the surface treated copper foil 8 is the roughness of the copper foil surface. For the etching rate, it is important that the roughness of the matt surface and the gloss surface of the copper foil both be small. For the recognition rate, it is important that the surface roughness of the side to be bonded to the film be small. Further, copper foil to be used for a PDP electromagnetic shield is also required to be a copper foil having a small surface roughness. A PDP is a display panel using emission of light by electrodischarge and is comprised of a glass vessel evacuated and then filled with mercury gas etc. Voltage is applied to cause electrodischarge. The ultraviolet light generated at this time strikes fluorescent coating previously applied to the inside of the glass vessel to cause emission of visible light. PDP has mainly been used for display applications at train stations and public facilities or exhibitions and family restaurants, but recently demand for household use large-scale televisions has been increasing.

In a PDP, leakage of the electromagnetic waves generated from the device is prevented by the arrangement of an electromagnetic shield at the front of the display (side close to viewer). As an electromagnetic shield for electromagnetic waves leaking from devices used in public facilities, use has been made of a sheet of glass provided on its entire surface with a thin film of silver, a fine nylon mesh material plated by copper, etc. However, in a home television, further reduction of the electromagnetic waves generated is required. This has become difficult with a conventional shield. Therefore, a type of shield comprised of a transparent film such as a polyester film on which copper foil is bonded and etched to leave a mesh of copper on the film has come into use. This shield is arranged in front of the display. The viewer views the light passing through parts without the mesh copper. To obtain a good image quality, the mesh has to have a good light transmission. Shields having a copper foil mesh of a width of 10 μm and a pitch of 200 μm are now being mass produced.

Since this mesh is produced by etching, the requirements on the copper foil for a PDP are similar to the requirements on copper foil for a high density printed circuit board. That is, in order to produce a copper foil mesh having a fine width, it is necessary that the roughness of the matt surface and the gloss surface of the copper foil both be small. A copper foil having a small surface roughness is required. Further, electronic devices are not only being reduce in size and weight, but also are being designed for further higher frequencies along with the increase of information transfer. Up to now, a high frequency signal over 1 GHz had been used for restricted radio use such as communications for aircraft and satellite communications, but recently is being used also for familiar electronic devices such as mobile phones and wireless LAN. The printed circuit boards for such high frequencies have to use a resin superior in high frequency characteristic. The copper foil has to be one having less high-frequency transfer loss. That is, the higher the frequency, the more noticeable the "skin effect" where a signal passes primarily at the surface part of a conductive layer. Due to this, when using a conventional copper foil having a large unevenness, the high-frequency transfer loss is large. Therefore, it can no longer be used for such applications.

A major factor influencing the high-frequency transfer loss is the surface roughness. The higher the frequency, the more noticeable the skin effect, so the roughness of the matt surface and the gloss surface of the copper foil both have to be small for the high-frequency transfer loss. There are two major factors influencing the roughness of the matt surface of the copper foil. One is the surface roughness of the matt surface of the untreated copper foil. Another is the method of deposition of granular copper in the roughening. If the surface roughness of the matt surface of the untreated copper foil is large, the surface roughness of the copper foil after roughening becomes large. The amount of deposition of the granular copper in the roughening can be adjusted by the current in the roughening. But the surface roughness of the untreated copper foil is primarily decided by the electrodeposition conditions when the copper to be deposited on the above drum-shaped cathode 2 in FIG. 1 and by the additives added to the electrolyte 3.

General electrodeposited copper foil is roughened on its matt surface to a surface roughness of about 6 μm at a thickness of 12 μm and about 10 μm at a thicker copper foil of 70 μm in terms of the surface roughness Rz (Rz as defined in JIS B0601-1994, "Definition and Description of Surface Roughness", 5.1 "Definition of 10-Point Average Roughness"). When the copper foil bonding surface for bonding with the resin substrate has a relatively large surface roughness in this way, a high bonding strength where copper particles which had been present on the roughened surface of the copper foil and part of the copper foil deposited in a branch-like manner deeply penetrate the resin substrate is obtained. On the other hand, it takes time to dissolve the copper particles and deposited copper in a branch-like manner penetrating the resin substrate completely in etching to form printed circuits resulting in the occurrence of so-called "etching residue". As a result, the bottom lines between the copper foil and the resin substrate become poor in linearity and insulation between adjacent circuits becomes poor when the distance between circuits is made narrower. In notable cases, a circuit is unable to be fabricated completely and the phenomenon of bridging of adjacent circuits occurs.

Further, the gloss surface (surface of side contacting drum) has gloss at first glance and seems to be smooth, but becomes a replica of the drum surface. The roughness is usually about 1.5 to 2.0 μm in terms of Rz in average. This is because manufacture is started in a state with the initial drum surface polished smooth, but later the drum surface is dissolved and gradually becomes rough along with continuance of manufacture of the electrodeposited copper foil due to the electrolyte being strongly acidic. If after manufacture of the electrodeposited copper foil for a certain time the drum surface becomes rough, the drum surface is polished again to smooth it, but seen on an average, the roughness is about 1.5 to 2.0 μm.

If the surface roughness is large, the bondability of the dry film etching resist bonded to the copper foil surface becomes locally good and locally bad. Therefore, the circuit is sometimes formed in a wave shape during etching. If becoming wavy in this way, the circuit becomes poor in linearity and the problem arises that it becomes difficult to form fine patterns. Further, in a case of using a liquid resist, while the degree is slight compared with a dry film resist, due to the difference of the dissolution rate between depressions and projections of the copper foil, the phenomenon of the shape of the circuit becoming wavy is seen in the same way. To deal with the requirement of increasing the pattern fineness, in addition to the roughness of the matt surface of the copper foil being small, it is important that the roughness of the gloss surface also be small.

Due to the above reasons, it is important that the surface of the copper foil be small in surface roughness of the side to be bonded with the film for the recognition rate and it is important that the surface roughness be small at both sides for a copper foil for use in a plasma display panel and high-frequency printed circuit board. Above, the importance of surface roughness was described with reference to an electrodeposited copper foil, but a rolled copper foil also has the same problems of course.

SUMMARY OF THE INVENTION

An object of the present invention is to provide a copper foil having a high etching factor, having superior linearity of bottom lines of a circuit pattern, having no copper partaicles remaining in the resin of the circuit pattern, capable of forming fine pattern, superior in recognition rate, and having a small high-frequency transmission loss.

According to the present invention, there is provided a copper foil for chip-on-film use, a plasma display panel, or a high-frequency printed circuit board obtained by rolling copper foil to smooth the surface to give a surface area of not more than 1.30 times an ideal smooth surface. The present invention is characterized by rolling the copper foil (below, unless otherwise alluded to, the term "copper foil" generally meaning an electrodeposited copper foil and a rolled copper foil) to smooth it to give a surface area as measured by a laser microscope (made by KEYENCE Co., model number: VK-8510) not more than 1.30 times, preferably not more than 1.20 times, of the ideal smooth surface.

Preferably, the smoothed copper foil surface is plated by at least one metal of Ni and Zn. By smoothing the copper foil surface by rolling and plating the smooth surface of the copper foil by at least one metal of Ni and Zn, it is possible to give bonding strength and chemical resistance.

Alternatively, on the smoothed copper foil surface, fine roughening particles of Cu or alloy particles of Cu and Mo or alloy particles comprising Cu and at least one element selected among a group of Ni, Co, Fe, and Cr or a mixture of the alloy particles and an oxide of at least one element selected among a group of V, Mo, and W are deposited. By smoothing the copper foil surface by rolling and making metal particles, alloy particles, or mixtures of various particles to adhere as fine roughening particles to the smoothed surface, fine roughening particles are adhered to the smoothed surface uniformly and the bonding strength with a resin substrate is increased.

More preferably, the fine roughening particles deposited on the smoothed surface are further provided with at least one type of metal plating layer selected from a group of Cu, Ni, Zn, Co, V, Mo, and W. In a copper foil on which fine roughening particles are deposited, depending on the deposition conditions of the fine roughening particles, sometimes particles do not deposit strongly on the copper foil. Further, depending on the next step of the processing, sometimes part of the fine roughening particles peel off during the treatment and deposit on the facilities, therefore fine roughening particles resistant to falling is being sought. To meet with this requirement, it is possible to plate the surface of the fine roughening particles as explained above and thereby suppress this peeling phenomenon (falling particles).

More preferably, the outermost layer surface is treated for stainproofing.

Alternatively, the outermost layer surface is treated for silane coupling.

More preferably, the outermost layer surface is treated for stainproofing and silane coupling. By treating the surface of the copper foil after rolling or the surface of the fine roughening particles deposited on the surface for stainproofing or for silane coupling, it is possible to prevent oxidation and discoloration of the copper foil.

Further, according to the present invention, there is provided a copper foil for chip-on-film use, a plasma display panel, or a high-frequency printed circuit board obtained by rolling electrodeposited copper foil or rolled copper foil using a work roll of a predetermined surface roughness with rolling oil of a predetermined viscosity and a speed suppressed to a range where no oil pits occur, having a surface area of not more than 1.30 times an ideal smooth surface. By rolling electrodeposited copper foil or rolled copper foil using a work roll of a predetermined surface roughness with rolling oil of a predetermined viscosity and a speed suppressed to a range where no oil pits occur, the copper foil having a surface area of not more than 1.30 times an ideal smooth surface can be surely obtained.

BRIEF DESCRIPTION OF THE DRAWINGS

The above-described object and features of the present invention will become clearer from the following description given with reference to the accompanying drawings, in which.

DESCRIPTION OF THE PREFERRED EMBODIMENTS

Figure 1:
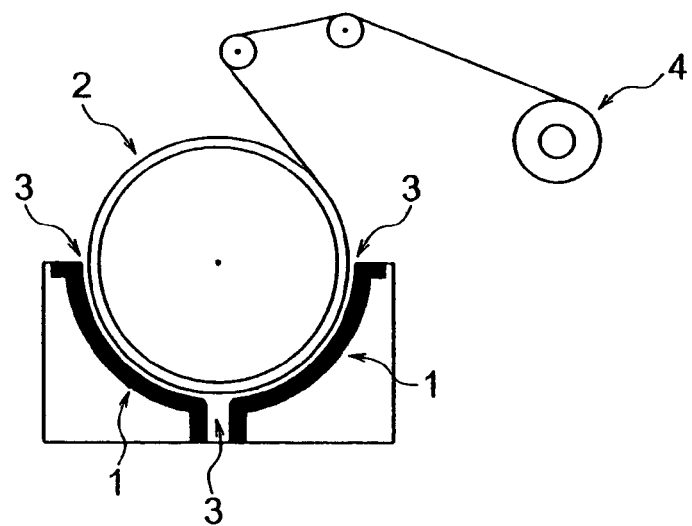
FIG. 1 is a view illustrating a structure of an electrodeposited copper foil production apparatus.
Figure 2:
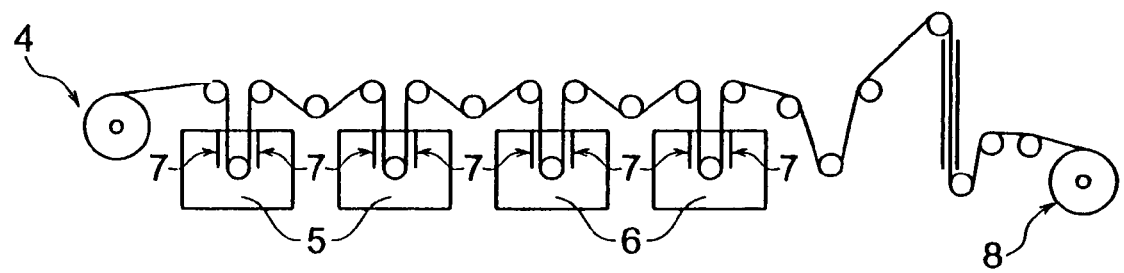
FIG. 2 is a view illustrating a surface treatment apparatus of electrodeposited copper foil.

The present inventors discovered that, first, the factors that decide the recognition rate in a COF are not only the transparency of a film itself, but also the surface area (surface unevenness) of the copper foil and that the recognition rate is better the closer the surface to the ideal smooth surface and the substantially permitted surface area is not more than 1.30 times the ideal smooth surface;

that, second, the point of making the pattern fineness closer to the ideal in a PDP is the surface area (surface unevenness) of a copper foil and the closer the surface to the ideal smooth surface, the better the pattern fineness, but due to the balance with the bondability, it is preferable that the surface area be 1.30 to 1.1 times the ideal smooth surface; and that, third the increased speed of communication and the difference in communication speed demanded in a copper foil for a high-frequency printed circuit board relate to the surface area (surface unevenness), that the closer the copper foil surface through which the radio frequency waves pass to the ideal smooth surface, the better the communication characteristics, and that to draw out superior communication characteristics, the surface area should be not more than 1.30 times the ideal smooth surface.

Next, the case of use of the copper foil of the present invention for a COF application will be explained. The polyimide resin with which the copper foil is bonded differs slightly in color, bonding strength with the copper foil, and other aspects of performance depending on the manufacturer. For example, the polyimide film made by a certain manufacturer is slightly inferior in the recognition rate of the film itself due to its deep color, but is superior in bondability with copper foil and enables a sufficient practical bonding strength even with copper foil without roughening of the present invention. In the present invention, copper foil was rolled to decrease the surface area to not more than 1.30 times the ideal smooth surface, was chromated for stainproofing and treated for silane coupling, then was bonded with the polyimide film. The circuit was formed, then the recognition rate for confirmation of the position of the IC and the bonding strength of the two were measured. Satisfactory results were obtained in this case.

Here, the "ideal smooth surface" is a perfectly flat surface without any unevenness. Further, original foil of a surface area of up to 1.30 times the ideal smooth surface was plated with at least one metal of Ni or Zn and further chromated for stainproofing and treated for silane coupling. When measuring the recognition rate, bonding strength, etc., it was confirmed that satisfactory results were obtained.

On the other hand, with the polyimide film made by another manufacturer, the transparency of the film itself is superior, but the bonding strength with the copper foil is inferior, so measures are necessary to raise the bonding strength. Original foil with a surface area of up to 1.30 times the ideal smooth surface was deposited with fine roughening particles of Cu or alloy particles of Cu and Mo or alloy particles comprising Cu and at least one element selected from a group of Ni, Co, Fe, and Cr or mixture of these alloy particles and oxides of at least one element selected among a group of V, Mo, and W, was chromated for stainproofing and treated for silane coupling, then was bonded with the polyimide film and etched to form a circuit. Next, the recognition rate, bonding strength, and other necessary characteristics were measured. Satisfactory results were confirmed.

The fine roughening particles deposited on the smoothed copper foil surface may be particles of Cu, but may also be alloy particles of Cu and Mo or alloy particles comprising Cu and at least one element (I) selected among a group of Ni, Co, Fe and Cr (hereinafter described as the "particles I") or a mixture of particles I and oxides of at least one element (II) selected among a group of V, Mo, and W (hereinafter described as the "particles II"). With FR-4 or another epoxy resin used for an ordinary rigid circuit board, it is possible to obtain desired bonding strength by Cu particles or alloy particles of Cu and Mo. However, in the case of a polyimide used for a COF application where the particles are smaller, it is difficult to secure the bonding strength with Cu particles or alloy particles of Cu and Mo, so it is effective to deposit the above-described particles I or particles II. The reason is that these particles I and II not only have simple anchoring effects, but also increase the chemical bonds with the polyimide and therefore give a high bonding strength.

As the particles I, for example particles of Cu—Ni alloys, Cu—Co alloys, Cu—Fe alloys, Cu—Cr alloys, etc. are preferable. The amount of the element (I) in the above alloy particles is preferably 0.1 to 3 mg/dm$^2$foil per 1 mg/dm$^2$foil of Cu, while the amount of the element (II) in the above mixture is preferably 0.02 to 0.8 mg/dm$^2$foil per 1 mg/dm$^2$foil of Cu. The reason is that in the particles I, if the amount of the element (I) is greater than 3 mg/dm$^2$foil per 1 mg/dm$^2$foil of Cu in the composition of the alloys, the problem arises that it is difficult to dissolve except Co when etching the circuit pattern and it remains on the resin substrate, while if the amount of the element (I) is less than 0.1 mg/dm$^2$foil in the composition of the alloys, the problem arises that an increase of bonding strength with respect to a resin substrate, for example, a polyimide resin substrate inferior in the bonding strength with the copper foil cannot be expected.

Among these particles I, Cu—Ni alloy particles or Cu—Co alloy particles are preferable because Ni or Co itself exhibits a high bonding strength to a resin substrate like polyimide, so the alloy particles as a whole also exhibit a high bonding strength with the resin substrate. In that case, C—Ni alloy particles or Cu—Co alloy particles giving an amount (of deposition) of Cu to the foil of 4 to 20 mg/dm$^2$ in terms of absolute amount and an amount (of deposition) of Ni or Co of 0.1 to 3 mg/mgCu is particularly preferable in the sense of exhibiting an extremely high bondability. The particles II are comprised of a mixture of the particles I and oxide particles. When electroplating the foil, the particles I deposit at the grain boundaries of the crystal grains, while simultaneously the element (II), for example, V, Mo, or W, forms oxide particles such as $V_2O_5$, $MoO_3$, or $WO_3$ and deposits in a state mixed with the particles I, whereby the particles II are formed. Therefore, these particles II coexist in a suitable mutually dispersed state. Note that the particles I selectively deposit on the crystal grain boundaries of the copper foil, but in that case, they tend not to uniformly deposit at all grain boundaries, but to concentrate at certain specific grain boundaries. If such a state of deposition proceeds, even if the overall amount of deposition increases, the particles I will not necessarily uniformly deposit at the grains boundaries as a whole and therefore the bonding strength with the resin substrate will fall at undeposited locations.

However, if electroplating in the copresence of V, Mo, W, or another element (II), while the reason is not clear, due to the action of the oxide particles of V, Mo, or W, the tendency of the particles I to concentrate at certain specific grain boundaries declines and the particles disperse to grain boundaries of a large number of crystal grains and therefore deposit uniformly as a whole. As a result, in the case of the particles II, the effect is obtained that the bondability with the resin substrate increases compared with deposition of the particles I alone. In the particles II, when the amount of the element (II) is greater than 0.8 mg/mgCu, sometimes when a peeling test is performed after press lamination on the resin substrate, oxides will remain on the resin substrate. Conversely, when less than 0.02 mg/mgCu, the effect of addition of the element (II) does not appear that much. Therefore, it is preferable to select a range of 0.8 to 0.02 mg/mgCu.

Sometimes, after bonding copper foil smoothed on its surface and deposited with fine roughening particles to the polyimide resin film and etching it to form a circuit, the circuit forming copper foil is tin plated. At this time, if the temperature of the Sn plating solution is very high, sometimes undercutting will occur where the plating solution penetrates between the copper foil and the film. Therefore, for such applications, it is necessary to design the composition of the fine roughening particles so as to prevent undercut. The inventors also studied this point and discovered that a composition of the fine roughening particles is preferably 0.1 to 3.0 mg/dm$^2$foil of Co and 0.1 to 3.0 mg/dm$^2$foil of Ni per 1 mg/dm$^2$foil of Cu, more preferably 1.2 to 2.2 mg/dm$^2$foil of Co and 0.1 to 2.0 mg/dm$^2$foil of Ni per 1 mg/dm$^2$foil of Cu, still more preferably 1.5 to 1.9 mg/dm$^2$foil of Co and 1.3 to 1.7 mg/dm$^2$foil of Ni per 1 mg/dm$^2$foil of Cu.

The electrodeposited copper foil or rolled copper coil used in the present invention may be any foil. It is sufficient that the rolling result in the surface area being reduced to not more than 1.30 times the ideal smooth surface. It is possible to select the necessary treatment among roughening, cover plating, Ni or Zn treatment, stainproofing, and silane coupling treatment depending on the type of the resin to be bonded to and the application.

Above, the explanation was given stressing the recognition rate and bondability in the COF field, but this copper foil is not limited to COF applications and can also be used as a copper foil for general fine pattern printed circuit boards, PDP electromagnetic shields, and high-frequency printed circuit boards.

Below, the present invention will be explained in more detail with reference to examples, but of course the invention is not limited to these.

Original foil 1

An untreated electrodeposited copper foil of a thickness of 10 μm, surface roughness Rz of the matt surface of 1.03 μm, and surface roughness Rz of the gloss surface of 1.20 μm was cold rolled by one pass to obtain an original foil 1 of a thickness of 9 μm. The rolling was performed using a smooth work roll of a surface roughness Ra (Ra as defined in JIS B0601-1994, "Definition and Description of Surface Roughness", 3.1 "Definition of Ra") of 0.03 μm, a 4 centistoke low viscosity rolling oil, and a speed suppressed to a range where no oil pits occur. The matt surface after rolling was measured for its surface area at a 80 μm×120 μm part (ideal smooth surface area of 9600 μM$^2$) by a laser microscope (made by KEYENCE Co., model number: VK-8510) to obtain a value of the surface area of 11,403 μm$^2$. This value was 1.19 times the ideal smooth surface area. Further, the matt surface before rolling was also measured and was of 12,871 μm$^2$ (1.34 times).

Original foil 2

An untreated electrodeposited copper foil of a thickness of 15 μm was cold rolled by two passes to manufacture an original foil 2 of a thickness of 12 μm. The surface of this original foil 2 was measured by a laser microscope (made by KEYENCE Co., model number: VK-8510). The surface area was calculated, whereby the surface was smoothed to 1.25 times the ideal smooth surface.

Original foil 3

An untreated electrodeposited copper foil of a thickness of 18 μm was cold rolled by three passes to manufacture an original foil 3 of a thickness of 12 μm. The surface of this original foil 3 was measured by a laser microscope (made by KEYENCE Co., model number: VK-8510). The surface area was calculated, whereby the surface was smoothed to 1.22 times the ideal smooth surface.

Original foil 4

A rolled copper foil of a thickness of 18 μm was further cold rolled by three passes to manufacture an original foil 4 of a thickness of 12 μm. The surface of this original foil 4 was measured by a laser microscope (made by KEYENCE Co., model number: VK-8510). The surface area was calculated, whereby the surface was smoothed to 1.19 times the ideal surface.

Electroplating A (nickel plating)

[Composition of the electroplating solution]

| | |
|---|---|
| Nickel sulfate 6-hydrate: | 240 g/liter |
| Nickel chloride 6-hydrate: | 45 g/liter |
| Boric acid: | 30 g/liter |
| Sodium hypophosphite: | 10 g/liter |

[Conditions]

| | |
|---|---|
| Temperature: | 20° C. |
| pH: | 3.5 |
| Current density: | 1 A/dm$^2$ |
| Treatment time: | 0.7 second |

Electroplating B (zinc plating)

[Composition of the electroplating solution]

| | |
|---|---|
| Zinc sulfate 7-hydrate: | 35 g/liter |
| Sodium hydroxide: | 70 g/liter |

[Conditions]

| | |
|---|---|
| Temperature: | 20° C. |
| Current density: | 0.25 A/dm$^2$ |
| Treatment time: | 3 seconds |

Electroplating C (fine roughening)

[Composition of the electroplating solution]

| | |
|---|---|
| Copper sulfate 5-hydrate: | 20 g/liter |
| Sulfuric acid: | 45 g/liter |
| Arsenic (As): | 140 mg/liter |

[Conditions]

| | |
|---|---|
| Temperature: | 20° C. |
| Current density: | 11 A/dm$^2$ |
| Treatment time: | 3 seconds |

Electroplating D (fine roughening)

After treatment by the electroplating solution 1, treatment by the electroplating solution 2 is performed.

[Composition of the electroplating solution 1]

| | |
|---|---|
| Copper sulfate 5-hydrate: | 98 g/liter |
| Sulfuric acid: | 100 g/liter |
| Ammonium molybdate: | 4 g/liter |

[Conditions]

| | |
|---|---|
| Temperature: | 35° C. |
| Current density: | 40 A/dm$^2$ |
| Treatment time: | 3.5 seconds |

[Composition of the electroplating solution 2]

| | |
|---|---|
| Copper sulfate 5-hydrate: | 236 g/liter |
| Sulfuric acid: | 100 g/liter |

[Conditions]

| | |
|---|---|
| Temperature: | 50° C. |
| Current density: | 20 A/dm$^2$ |
| Treatment time: | 7 seconds |

Electroplating E (fine roughening)

[Composition of the electroplating solution]

| | |
|---|---|
| Copper sulfate 5-hydrate: | 20 g/liter |
| Cobalt sulfate 7-hydrate: | 38 g/liter |
| Nickel sulfate 6-hydrate: | 36 g/liter |
| Ammonium sulfate: | 40 g/liter |
| Boric acid: | 20 g/liter |

[Conditions]

| | |
|---|---|
| Temperature: | 40° C. |
| pH: | 3.5 |
| Current density: | 15 A/dm$^2$ |
| Treatment time: | 3 seconds |

Electroplating F (fine roughening)

[Composition of the electroplating solution]

| | |
|---|---|
| Copper sulfate 5-hydrate: | 20 g/liter |
| Nickel sulfate 6-hydrate: | 54 g/liter |
| Ammonium metavanadate: | 2 g/liter |
| Boric acid: | 20 g/liter |

[Conditions]

| | |
|---|---|
| Temperature: | 40° C. |
| pH: | 3.5 |
| Current density: | 10 A/dm$^2$ |
| Treatment time: | 3 seconds |

Electroplating G (metal plating layer)

[Composition of the electroplating solution]

| | |
|---|---|
| Cobalt sulfate 7-hydrate: | 76 g/liter |
| Boric acid: | 30 g/liter |

[Conditions]

| | |
|---|---|
| Temperature: | 40° C. |
| pH: | 3.1 |
| Current density: | 5.6 A/dm$^2$ |
| Treatment time: | 5 seconds |

Electroplating H (stainproofing: cathode chromating)

[Composition of the electroplating solution]

| | |
|---|---|
| Chromium trioxide: | 3 g/liter |

[Conditions]

| | |
|---|---|
| Temperature: | 33° C. |
| Current density: | 3 A/dm$^2$ |
| Treatment time: | 1 second |

Silane coupling treatment I

[Composition of the electroplating solution]

| | |
|---|---|
| 3-glycidoxy propylmethoxysilane: | 1 g/liter |

[Conditions]

| | |
|---|---|
| Temperature: | Room temperature |
| Treatment: | Dip, then squeegee, heat and dry |

EXAMPLE 1

The original foil 1, original foil 2, original foil 3, and original foil 4 were treated by the electroplating H for stainproofing and by the silane coupling treatment I, then bonded at a high temperature and high pressure to polyimide films. The bondability was superior. Next, dry film etching resists were bonded to the surfaces of these copper foils and etched to prepare COF resin substrates. When producing the COF resin substrates, the circuits did not become wavy in shape, the circuits became extremely good in linearity, and fine patterns of a width of 15 μm and a conductor pitch of 15 μm were completed. The IC chips were positioned by recognition through the parts of the polyimide films from which the foils were etched, but it was also possible to easily confirm the positions of the IC chips from above and connect IC chips and COF circuits accurately. Further, the undercut phenomenon in Sn plating also could not be observed.

EXAMPLE 2

The original foil 1, original foil 2, original foil 3, and original foil 4 were nickel plated by the electroplating A and zinc plated by the electroplating B, then treated for stainproofing by the electroplating H and subjected to the silane coupling treatment I. The copper foils were bonded at a high temperature and high pressure to polyimide films. The bondability was superior. Next, dry film etching resists were bonded to the surfaces of these copper foils and etched to prepare COF resin substrates. When producing the COF resin substrates, the circuits did not become wavy in shape, the circuits became extremely good in linearity, and fine patterns of a width of 15 µm and a conductor pitch of 15 µm were completed. The IC chips were positioned by recognition through the parts of the polyimide films from which the foils were etched, but it was also possible to easily confirm the positions of the IC chips from above and connect IC chips and COF circuits accurately. Further, the undercut phenomenon in Sn plating also could not be observed.

EXAMPLE 3

The original foil 1, original foil 2, original foil 3, and original foil 4 were finely roughened by electroplating C, then treated for stainproofing by the electroplating H and subjected to the silane coupling treatment I. The copper foils were coated with a polyimide resin, then heated to cure the resin to form films. The results were then aged by heating to produce copper-clad polyimide films. The bondability of the copper and polyimide films in these copper-clad polyimide films was good. Next, the copper foils were bonded with dry film etching resists and etched to prepare COF resin substrates. When producing the COF resin substrates, the circuits did not become wavy in shape, the circuits became extremely good in linearity, and fine patterns of a width of 25 µm and a conductor pitch of 25 µm were completed. The IC chips were positioned by recognition through the parts of the polyimide films from which the foils were etched, but it was also possible to easily confirm the positions of the IC chips from above and connect IC chips and COF circuits accurately. Further, the undercut phenomenon in Sn plating also could not be observed.

EXAMPLE 4

The original foil 1, original foil 2, original foil 3, and original foil 4 were finely roughened by electroplating D, then treated for stainproofing by the electroplating H and subjected to the silane coupling treatment I. The copper foils were coated with a polyimide resin, then heated to cure the resin to form films. The results were then aged by heating to produce copper-clad polyimide films. The bondability of the copper and polyimide films in these copper-clad polyimide films was good. Next, the copper foils were bonded with dry film etching resists and etched to prepare COF resin substrates. When producing the COF resin substrates, the circuits did not become wavy in shape, the circuits became extremely good in linearity, and fine patterns of a width of 25 µm and a conductor pitch of 25 µm were completed. The IC chips were positioned by recognition through the parts of the polyimide films from which the foils were etched, but it was also possible to easily confirm the positions of the IC chips from above and connect IC chips and COF circuits accurately. Further, the undercut phenomenon in Sn plating also could not be observed.

EXAMPLE 5

The original foil 1, original foil 2, original foil 3, and original foil 4 were finely roughened by electroplating E, then treated for stainproofing by the electroplating H and subjected to the silane coupling treatment I. The copper foils were coated with a polyimide resin, then heated to cure the resin to form films. The results were then aged by heating to produce copper-clad polyimide films. The bondability of the copper and polyimide films in these copper-clad polyimide films was good. Next, the copper foils were bonded with dry film etching resists and etched to prepare COF resin substrates. When producing the COF resin substrates, the circuits did not become wavy in shape, the circuits became extremely good in linearity, and fine patterns of a width of 20 µm and a conductor pitch of 20 µm were completed. The IC chips were positioned by recognition through the parts of the polyimide films from which the foils were etched, but it was also possible to easily confirm the positions of the IC chips from above and connect IC chips and COF circuits accurately. Further, the undercut phenomenon in Sn plating also could not be observed.

EXAMPLE 6

The original foil 1, original foil 2, original foil 3, and original foil 4 were finely roughened by electroplating F, then treated for stainproofing by the electroplating H and subjected to the silane coupling treatment I. The copper foils were coated with a polyimide resin, then heated to cure the resin to form films. The results were then aged by heating to produce copper-clad polyimide films. The bondability of the copper and polyimide films in these copper-clad polyimide films was good. Next, the copper foils were bonded with dry film etching resists and etched to prepare COF resin substrates. When producing the COF resin substrates, the circuits did not become wavy in shape, the circuits became extremely good in linearity, and fine patterns of a width of 25 µm and a conductor pitch of 25 µm were completed. The IC chips were positioned by recognition through the parts of the polyimide films from which the foils were etched, but it was also possible to easily confirm the positions of the IC chips from above and connect IC chips and COF circuits accurately. Further, the undercut phenomenon in Sn plating also could not be observed.

EXAMPLE 7

The original foil 1, the original foil 2, the original foil 3, and the original foil 4 were finely roughened by the electroplating E. With the foils in this state, sometimes the problem arises of the fine roughening particles being rubbed off by the guide roll and depositing on the surface of the roll when laminating the polyimide film during the process of production of a PDP electromagnetic shield. In order to prevent this, the fine roughening particles were plated with a covering Co metal plating layer by the electroplating G. Then, the foils were treated for stainproofing by the electroplating H and silane coupling treatment I. The copper foils were laminated to polyimide films. At the time of this process, no separation of the fine roughening particles and deposition on the guide roll were seen at all. Next, the copper foils were coated with a liquid etching resist and etched to prepare PDP electromagnetic shields. These PDP electromagnetic shields had extremely good linearity of the circuits. PDP electromagnetic shields of fine patterns of a width of 9 µm and a conductor pitch of 200 µm were completed. These PDP electromagnetic shields satisfied the Class B requirements of EN5022 for electromagnetic shielding and can be adopted for home television sets.

EXAMPLE 8

The original foil 1, the original foil 2, the original foil 3, and the original foil 4 were finely roughened by the electroplating F, then were treated for stainproofing by the electroplating H and silane coupling treatment I. The surface of the copper foils were covered with glass cloth prepregs impregnated with a high-frequency substrate use resin and then these were hot pressed to prepare copper-clad substrates. Next, the copper foils were bonded with dry film etching resists and etched to obtain high-frequency printed circuit boards. These high-frequency printed circuit boards had extremely good linearity of the circuits. High-frequency printed circuit boards of patterns of a width of 100 µm and a conductor pitch of 100 µm were completed. 4 GHz signals were sent over 500 mm by these high-frequency printed circuit boards, whereupon it was found that the transmission loss was 19% less compared with a case of using ordinary copper foil and almost no time error was measured.

Summarizing the effects of the invention, by smoothening the surface of the copper foil, it is possible to provide a copper foil suitable for COF use, a PDP, or a fine pattern printed circuit board (especially for high-frequency).

While the invention has been described with reference to specific embodiments chosen for purpose of illustration, it should be apparent that numerous modifications could be made thereto by those skilled in the art without departing from the basic concept and scope of the invention.

What is claimed is:

1. A copper foil for chip-on-film use, a plasma display panel, or a high-frequency printed circuit board comprising a smooth surface having a surface area of not more than 1.30 times a surface area of an ideal smooth surface and formed on said smooth surface are fine roughening alloy particles of Cu and Mo or alloy particles comprising Cu and at least one element (I) selected among a group of Ni, Co, Fe, and Cr or a mixture of said alloy particles and an oxide of at least one element (II) selected among a group of V, Mo, and W, an amount of said one element (I) in said alloy particles being 0.1 to 3 mg/dm$^2$foil per 1 mg/dm$^2$foil of Cu or an amount of said one element (II) in said mixture being 0.02 to 0.8 mg/dm$^2$foil per 1 mg/dm$^2$foil of Cu, wherein the copper foil is obtained by rolling copper foil to form the smooth surface.

2. A copper foil as set forth in claim 1, wherein the smoothed copper foil surface is plated with at least one metal of Ni and Zn.

3. A copper foil as set forth in claim 1, wherein a metal plating layer selected from a group of Cu, Ni, Zn, Co, V, Mo, and W is formed over the fine roughening particles deposited on the smoothed surface.

4. A copper foil as set forth in any one of claims 1, 2, and 3, wherein the outermost layer surface is treated for stainproofing.

5. A copper foil as set forth in any one of claims 1, 2, and 3, wherein the outermost layer surface is treated for silane coupling.

6. A copper foil as set forth in any one of claims 1, 2, and 3, wherein the outermost layer surface is treated for stainproofing and silane coupling.

7. A copper foil for chip-on-film use, a plasma display panel, or a high-frequency printed circuit board comprising a smooth surface having a surface area of not more than 1.30 times a surface area of an ideal smooth surface and formed on said smooth surface are fine roughening alloy particles of Cu and Mo or alloy particles comprising Cu and at least one element (I) selected among a group of Ni, Co, Fe, and Cr or a mixture of said alloy particles and an oxide of at least one element (II) selected among a group of V, Mo, and W, an amount of said one element (I) in said alloy particles being 0.1 to 3 mg/dm$^2$foil per 1 mg/dm$^2$foil of Cu or an amount of said one element (II) in said mixture being 0.02 to 0.8 mg/dm$^2$foil per 1 mg/dm$^2$foil of Cu, wherein the copper foil is obtained by rolling electrodeposited copper foil or rolled copper foil using a work roll of a predetermined surface roughness with rolling oil of a predetermined viscosity and a speed suppressed to a range where no oil pits occur.

* * * * *